US006629306B2

(12) United States Patent
Bobba et al.

(10) Patent No.: US 6,629,306 B2
(45) Date of Patent: Sep. 30, 2003

(54) SIGNAL ROUTING BASED APPROACH FOR INCREASING DECOUPLING CAPACITANCE USING PREFERENTIAL SHIELDING

(75) Inventors: Sudhakar Bobba, Sunnyvale, CA (US); Tyler Thorp, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/997,918

(22) Filed: Nov. 30, 2001

(65) Prior Publication Data

US 2003/0106035 A1 Jun. 5, 2003

(51) Int. Cl.[7] .............................................. G06F 17/50
(52) U.S. Cl. ................................ 716/12; 716/1; 716/14; 716/13; 716/10
(58) Field of Search ........................ 716/1–21; 326/101, 326/21, 26, 41, 82

(56) References Cited

U.S. PATENT DOCUMENTS

| 5,027,321 | A |   | 6/1991  | Park ............................ 365/185 |
| 5,436,573 | A | * | 7/1995  | Ogawa et al. ................. 326/17 |
| 6,184,702 | B1 | * | 2/2001  | Takahashi et al. ............ 326/21 |
| 6,229,095 | B1 |   | 5/2001  | Kobayashi .................... 174/255 |
| 6,353,917 | B1 | * | 3/2002  | Muddu et al. .................. 716/6 |
| 6,449,753 | B1 | * | 9/2002  | Aingaran et al. .............. 716/5 |
| 6,487,706 | B1 | * | 11/2002 | Barkley et al. ................. 716/7 |
| 2002/0076941 | A1 | * | 6/2002  | Ushiyama et al. ........... 438/773 |
| 2002/0174408 | A1 | * | 11/2002 | Naffziger et al. .............. 716/5 |

FOREIGN PATENT DOCUMENTS

EP          0 575 892 A1      6/1993      ........... H01L/25/16

OTHER PUBLICATIONS

C. Ababei, et al "Probabilistic Aspects of Crosstalk Problems in CMOS ICs", IEEE 2000, Custom Integrated Circuits Conference, pp 117–120.*
D. A. Kirkpatrick et al "Digital Sensitivity: Predicting Signal Interaction using Functional Analysis", 1996 IEEE/ACM, ICCAD—96, Digest of Technical Papers, pp 536–541.*
European Search Report dated Apr. 23, 2003 (1 page).

* cited by examiner

Primary Examiner—Matthew Smith
Assistant Examiner—Magid Dimyan
(74) Attorney, Agent, or Firm—Rosenthal & Osha L.L.P.

(57) ABSTRACT

A method for preferentially shielding a signal to increase implicit decoupling capacitance is provided. The signal is preferentially shielded by using a probability of the signal being at a specific value to determine where to route the signal. Further, an integrated circuit that preferentially shields a signal to increase decoupling capacitance by 2using a probability of the signal being at a specific value to determine where to route the signal. Further, a computer system for preferentially shielding a signal to increase decoupling capacitance by using a probability of the signal being at a specific value to determine where to route the signal. Further, a computer readable medium having executable instructions for preferentially shielding a signal to increase implicit decoupling capacitance by using a probability of the signal being at a specific value to determine where to route the signal.

28 Claims, 4 Drawing Sheets

SIGNAL ROUTING BASED APPROACH FOR INCREASING DECOUPLING CAPACITANCE USING PREFERENTIAL SHIELDING

BACKGROUND OF INVENTION

A typical computer system has at least a microprocessor and memory. The microprocessor processes, i.e., executes, instructions to accomplish various tasks of the computer system. Such instructions, along with the data required by the microprocessor when executing these instructions, are stored in some form of memory. FIG. 1 shows a typical computer system having a microprocessor (10) and some form of memory (20). The microprocessor (10) has, among other components, a central processing unit (also known and referred to as "CPU" or "execution unit") (12) and a memory controller (also known as "load/store unit") (14). The CPU (12) is where the actual arithmetic and logical operations of the computer system take place. To facilitate the execution of operations by the CPU (12), the memory controller (14) provides the CPU (12) with necessary instructions and data from the memory (20). The memory controller (14) also stores information generated by the CPU (12) into the memory (20).

The operations that occur in a computer system, such as the logical operations in the CPU and the transfer of data between the CPU and memory, require power. If the components responsible for carrying out specific operations do not receive adequate power in a timely manner, computer system performance is susceptible to degradation. As an added challenge, power consumption of modern computers has increased as a consequence of increased operating frequencies. Thus, providing power to the components in a computer system in a sufficient and timely manner has become an issue of significant importance.

Often, power supplied to a computer system component varies, which, in turn, affects the integrity of the component's output. Typically, this power variation results from the distance between a power supply for the component and the component itself. This distance may lead to the component not receiving power (via current) at the exact time it is required. One approach used by designers to combat this performance-inhibiting behavior is introducing decoupling capacitance (also referred to as "decap") to a particular circuit by positioning one or more decoupling capacitors close to the component. These decoupling capacitors store charge from the power supply and distribute the charge to the component when needed. For example, if power received by a component from a power supply attenuates, one or more decoupling capacitors will distribute charge to the component to ensure that the component is not affected by the power variation on the power supply. In essence, a decoupling capacitor acts as a local power supply for one or more specific components in a computer system.

Within a computer system component, such as a circuit, there are two types of decoupling capacitance: implicit and explicit. Explicit decoupling capacitance is provided to the circuit through the use of decoupling capacitors as discussed above. Implicit decoupling capacitance (also known in the art as "parasitic capacitance" or "inherent capacitance") is capacitance that is inherent in a circuit. Implicit decoupling capacitance results from the electromagnetic effects between current-carrying wires. Further, implicit decoupling capacitance is a function of the distance between two such wires. Also, the ability to help supplement an attenuating voltage using explicit decoupling capacitors or implicit decoupling capacitance is a function of the potential applied to the decaps.

FIG. 2 shows the presence of explicit and implicit decoupling capacitance in a section of a typical computer system component (40). The component (40) has a power supply bus (44) and a ground bus (46) that provides power through a connection to a power supply (42). The power supply (42) may be a part of the component (40) or a separate element. Power from the power supply (42) is made available to multiple power supply lines (48) and (52) via connections to the power supply bus (44) and to multiple ground lines (50) and (54) via connections to the ground bus (46). Power from the power supply (42) is delivered to chip logic circuits (60) and (68) via the power supply lines (48) and (52), respectively, and ground lines (50) and (54), respectively. When there is power variation across the power supply (42), explicit decoupling capacitors (56), (57), (58), and (59) positioned in parallel with the power supply (42) provides charge, i.e., power, to the chip logic circuits (60) and (68).

Still referring to FIG. 2, the existence of implicit decoupling capacitances (64), (66), (72), and (74) is shown. A first occurrence of implicit decoupling capacitance (64) occurs between the power supply line (48) and a signal line (62) from the chip logic (60). A second occurrence of implicit decoupling capacitance (66) occurs between the signal line (62) and the ground line (50). The implicit decoupling capacitances (64) and (66) are dependent on the characteristics of the signal line (62), specifically, whether a signal on the signal line (62) is high or low. When the signal is low, the implicit decoupling capacitance provided to the chip logic (60) is equal to the implicit decoupling capacitance (64) between the power supply line (48) and the signal line (62). Alternatively, when the signal is high, the implicit decoupling capacitance provided to the chip logic (60) is equal to the implicit decoupling capacitance (66) between the signal line (62) and the ground line (50).

Still referring to FIG. 2, implicit decoupling capacitance is also present in a substantial number of additional circuits. For example, another first occurrence of implicit decoupling capacitance (72) occurs between the power supply line (52) and a signal line (70) from the chip logic (68). Another second occurrence of implicit decoupling capacitance (74) occurs between the signal line (70) and the ground line (54). The implicit decoupling capacitances (72) and (74) are dependent on the characteristics of the signal line (70), specifically, whether a signal on the signal line (70) is high or low. When the signal is low, the implicit decoupling capacitance provided to the chip logic (68) is equal to the implicit decoupling capacitance (72) between the power supply line (52) and the signal line (70). Alternatively, when the signal is high, the implicit decoupling capacitance provided to the chip logic (68) is equal to the implicit decoupling capacitance (74) between the signal line (70) and the ground line (54).

With reference to FIG. 2, one of ordinary skill in the art will understand that even with a limited number of logic circuits (60, 68), the number of connecting lines, including power supply lines (48, 52), ground lines (50, 54), and signal lines (62, 70), is numerous. As the number of logic circuits increase, generally, the number of connecting lines increase accordingly. To manage the proper connection of power, ground, and/or signal lines, a program, often called a "routing program" or "router", is executed on a computer to route the connections.

A database is used to maintain information necessary for the manufacture of an integrated circuit. The locations of the logic circuits, along with their connections to other circuits, form some of the information contained in the database. A routing program, often using a set of rules, is responsible for making the appropriate connections between elements on the integrated circuit. The set of rules varies, but may include, among other things, which signals are routed first, locations where a signal may or may not be routed, whether the signals must stay on a grid or can be freeform, width of the signal lines, spacing between signal lines, and which layers are allowed to be used in a multilayer connection arrangement.

SUMMARY OF INVENTION

According to one aspect of the present invention, a method for preferentially shielding a signal path having a value switchable between a first potential and a second potential comprises determining a probability of the value being at the first potential versus the second potential, assigning a third potential to a first plurality of shields, assigning a fourth potential to a second plurality of shields, defining a plurality of possible routing channels among the first plurality of shields and the second plurality of shields, and assigning the signal path to one of the plurality of possible routing channels depending on a relationship among the probability, the third potential and the fourth potential.

According to another aspect, an integrated circuit comprises a signal having a value switchable between a first potential and a second potential, the value having a probability of being at the first potential versus the second potential; a first plurality of shields at a third potential; and a second plurality of shields at a fourth potential where the signal is routed along one of a plurality of possible routing channels among the first plurality of shields and the second plurality of shields, and where one of the plurality of possible routing channels is selected based upon a relationship among the probability, the third potential and the fourth potential.

According to another aspect, a computer system for preferentially routing a signal having a value switchable between a first potential and a second potential on an integrated circuit comprises a processor, a memory, and software instructions stored in the memory for enabling the computer system under control of the processor for determining a probability of the value being at the first potential versus the second potential, assigning a third potential to a first plurality of shields, assigning a fourth potential to a second plurality of shields, defining a plurality of possible routing channels among the first plurality of shields and the second plurality of shields, and assigning the signal to one of the plurality of possible routing channels depending on a relationship among the probability, the third potential and the fourth potential.

According to another aspect, a computer-readable medium having recorded thereon instructions executable by a processor, where the instructions are for determining a probability of a signal value being at a first potential versus a second potential, determining a third potential of a first plurality of shields, determining a fourth potential of a second plurality of shields, identifying a plurality of possible routing channels among the first plurality of shields and the second plurality of shields, and assigning the signal to one of the plurality of possible routing channels depending on a relationship among the probability, the third potential and the fourth potential.

Other aspects and advantages of the invention will be apparent from the following description and the appended claims.

DETAILED DESCRIPTION

Embodiments of the present invention relate to a circuit that uses preferential shielding to increase implicit decoupling capacitance. Embodiments of the present invention further relate to a method for increasing implicit decoupling capacitance. Embodiments of the present invention further relate to a means for increasing implicit decoupling capacitance. Embodiments of the present invention further relate to a computer system that preferentially shields a wire to increase system performance. Embodiments of the present invention further relate to a means for increasing implicit decoupling capacitance by determining an appropriate routing channel for a signal so that it is preferentially shielded. Embodiments of the present invention further relate to a computer system that routes a signal so that it is preferentially shielded to increase system performance. Embodiments of the present invention further relate to a program executed on a computer for increasing implicit decoupling capacitance by determining an appropriate routing channel for a signal such that it is shielded by a preferential potential.

Figure 1:
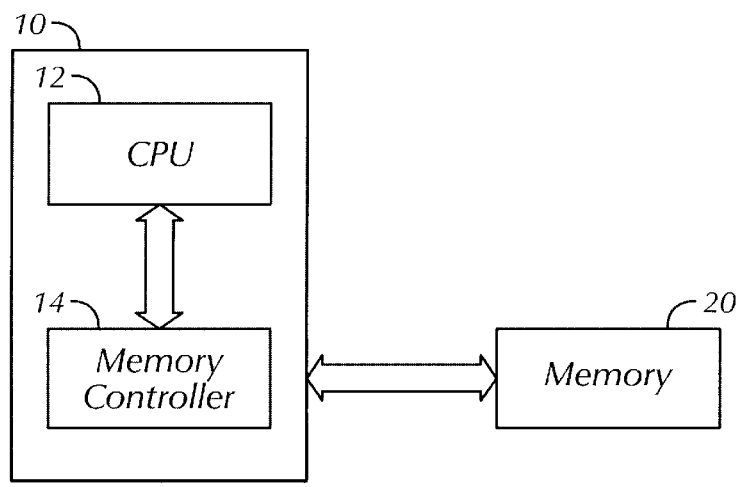
FIG. 1 shows a typical computer system.
Figure 2:
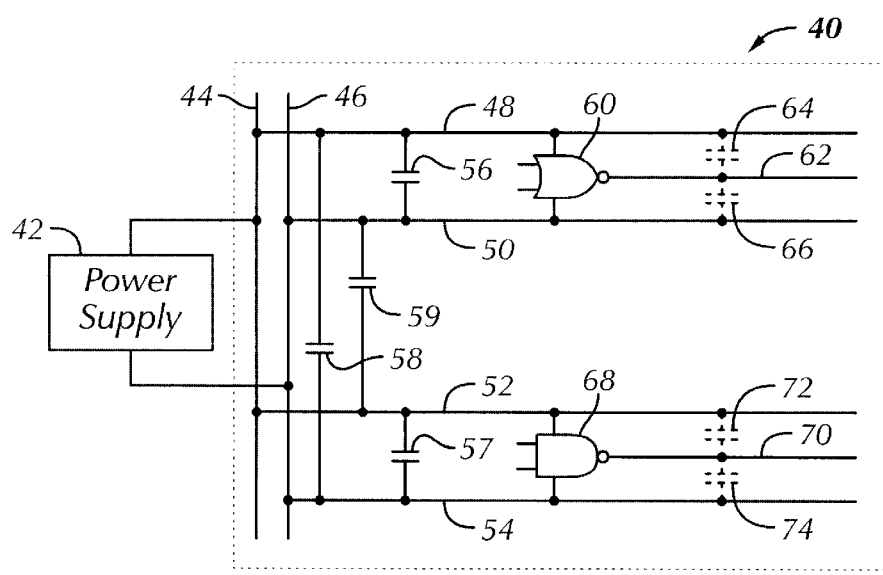
FIG. 2 shows a section of a typical computer system component.

In FIG. 2, during the course of normal operation of the computer system component (40), chip logic circuits (60) and (68) may generate a signal on signal lines (62) and (70) that statistically spends more time in either the high or low state. Depending on the statistically tendencies of the signal lines (62) and (70), the implicit decoupling capacitances (64) and (66) may not be equal, and the implicit decoupling capacitances (72) and (74) may not be equal, respectively.

As discussed above with reference to FIG. 2, a signal on the signal line may be high or low, and depending on the value of that signal, the amount of implicit decoupling capacitance present can be determined. In other words, the amount of implicit decoupling capacitance present on a signal line is a function of whether a signal on the signal line is high or low relative to a respective power supply or ground line. Regardless of whether a signal has a tendency to have a particular value, however, the amount of implicit decoupling capacitance present will be equal to the amount of implicit decoupling capacitance that would be present if the signal had another value. In other words, no preference is given in assigning the potential of the lines near the signal line. For example, although a NOR gate under normal conditions has a tendency to output low, the amount of implicit decoupling capacitance present will be the same for when the NOR gate outputs low and when the NOR gate outputs high.

The present invention takes into account the probability of a signal having a specific value. By knowing the probability, a signal line for the signal is routed amongst shields that are in place so that the signal is shielded with a preferred potential. This technique assists in the routing of the signal, amongst a plurality of placed shields, to maximize the implicit decoupling capacitance between the signal line and its shield. By using the probability the signal is at a specific value, those skilled in the art will appreciate that the problem can be formulated to maximize the implicit decoupling capacitance. By using the probability the signal is at a specific value and routing the signal amongst a plurality of shields to skew the implicit capacitance, the maximum effective capacitance is achieved.

Figure 3:
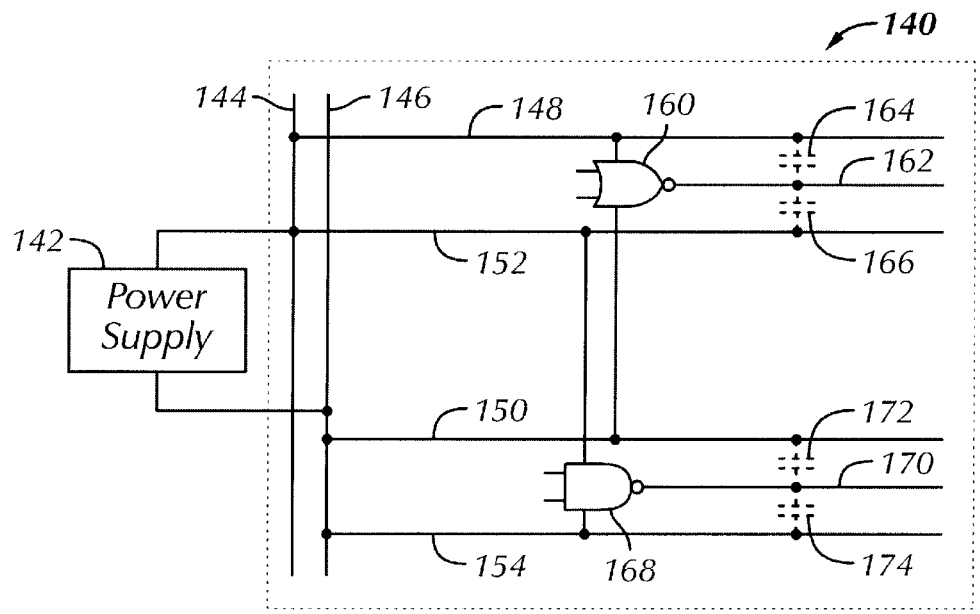
FIG. 3 shows a circuit in accordance with an embodiment of the present invention.

FIG. 3 shows an exemplary circuit (140) in accordance with an embodiment of the present invention. The circuit (140) has a power supply bus (144) and a ground bus (146) that provides power to a two-input NOR gate (160) through a power supply line (148) and a ground line (150). The power supply (142) may be a part of the circuit (140) or a separate element. Power from the power supply (142) is made available to multiple power supply lines (148) and (152) via connections to the power supply bus (144) and to multiple ground lines (150) and (154) via connections to the ground bus (146). Power from the power supply (142) is delivered to chip logic circuits (160) and (168) via the power supply lines (148) and (152), respectively, and ground lines (150) and (154), respectively. The two-input NOR gate (160) outputs a signal on a signal line, or signal path, (162). The implicit decoupling capacitance is equal to the implicit decoupling capacitance (164) between the signal line (162) and the power supply line (148), acting as a first shield, plus the implicit decoupling capacitance (166) between the signal line (162) and the power supply line (152), acting as a second shield, while the signal line (162) is low. The implicit decoupling capacitance is essentially zero while the signal line (162) is high. This relationship may be represented as shown in Equation 1:

$$C_{IMP}=(Decap_1+Decap_2) \text{ when Signal Line=low,}$$

$$C_{IMP}=0 \text{ when Signal Line=high,} \quad \text{(Equation 1)}$$

where $Decap_1$ is equal to the implicit decoupling capacitance (164) between the power supply line (148) and the signal line (162) when the signal line (162) is low, and where $Decap_2$ is equal to the implicit decoupling capacitance (166) between the power supply line (152) and the signal line (162) when the signal line (162) is low. When the signal line (162) is high, both the implicit decoupling capacitances (164) and (166) are essentially zero. From Equation 1, it is apparent that the shielding signal line (162) with power supply line (148) and power supply line (152) increases the amount of implicit decoupling capacitance. In fact, the longer signal line (162) is low, the greater the implicit decoupling capacitance, as shown in Equation 1. Equally stated, the average implicit decoupling capacitance over time is the probability the signal line (162) is low times the implicit decoupling capacitance when the signal line (162) is low, as defined in Equation 1. The average decoupling capacitance $AvgC_{IMP}$ is:

$$AvgC_{IMP}=P_L*(Decap_1+Decap_2), \quad \text{(Equation 2)}$$

where $P_L$ is equal to the probability that the signal is low. From Equation 2, it is apparent that in order to maximize the amount of implicit decoupling capacitance, the implicit decoupling capacitance is increased for the situation that has the higher probability on the signal line (162).

Of the four possible input combinations to the NOR gate (160), only one combination causes the NOR gate (160) to output high. The other three input combinations cause the NOR gate (160) to output low. Assuming an independent and evenly distributed probability for the inputs to the NOR gate (160), the probability that a signal outputted from the NOR gate (160) is high is 0.25 and the probability that a signal outputted from the NOR gate (160) is low is 0.75. Accordingly, the signal from the NOR gate (160) is said to be "predominantly low."

In order to maximize the amount of implicit decoupling capacitance on the signal line (162) according to Equation 2, the signal line (162) is shielded such that both of the shielding lines (148) and (152) are connected to the power supply bus (144). The signal on the signal line (162) is three times more likely to be low; therefore, the implicit decoupling capacitance created by implicit decoupling capacitance (164) and implicit decoupling capacitance (166) exists 75% of the time and provides essentially no implicit decoupling capacitance only 25% of the time.

Those skilled in the art will appreciate that shield assignment, whether it is with a power supply line and a ground line, with a power supply line and a power supply line, or with a ground line and a ground line, the delay of the signal on the signal line does not change. Using preferential shielding, therefore, does not increase the signal delay compared to typical shielding arrangements. By creating an imbalance in the implicit decoupling capacitance based on the probability the signal is at a specific value, the amount of implicit decoupling capacitance is increased.

Those skilled in the art will appreciate that power supply line (148) and power supply line (152) act as shields. Further, those skilled in the art will appreciate that a different potential can be used on shielding line (148) and shielding line (152). Those skilled in the art will also appreciate that only one shielding line (148) or shielding line (152) may be used.

Still referring to FIG. 3, an exemplary circuit (140) is also provided with a two-input NAND gate (168) that receives power from the power supply bus (144) and from the ground bus (146) via power supply line (152) and ground line (154). The two-input NAND gate (168) outputs a signal on a signal line, or signal path, (170). The implicit decoupling capacitance is equal to the implicit decoupling capacitance (172) between the signal line (170) and the ground line (150), acting as a first shield, plus the implicit decoupling capacitance (174) between the signal line (170) and the ground line (154), acting as a second shield, while the signal line (170) is high. The implicit decoupling capacitance is essentially zero while the signal line (170) is low. This relationship may be represented as shown in Equation 3:

$$C_{IMP}=(Decap_1+Decap_2) \text{ when Signal Line=high,}$$

$$C_{IMP}=0 \text{ when Signal Line=low,} \quad \text{(Equation 3)}$$

where $Decap_1$ is equal to the implicit decoupling capacitance (172) between the ground line (150) and the signal line (170) is high, and where $Decap_2$ is equal to the implicit decoupling capacitance (174) between the ground line (154) and the signal line (170) when the signal line (170) is high. When the signal line (170) is low, both the implicit decoupling capacitances (172) and (174) are essentially zero. From Equation 3, it is apparent that that shielding signal line (170) with ground line (150) and ground line (154) increases the amount of implicit decoupling capacitance. In fact, the longer signal line (170) is high, the greater the implicit decoupling capacitance, as shown in Equation 3. Equally stated, the average implicit decoupling capacitance over time is the probability the signal line (170) is high times the implicit decoupling capacitance when the signal line (170) is high, as defined in Equation 3. The average decoupling capacitance AvgC$_{IMP}$ is:

$$AvgC_{IMP}=P_H*(Decap_1+Decap_2),\quad\quad\text{(Equation 4)}$$

where P$_H$ is equal to the probability that the signal is high. From Equation 4, it is apparent that in order to maximize the amount of implicit decoupling capacitance, the implicit decoupling capacitance is increased for the situation that has the higher probability on the signal line (170).

Of the four possible input combinations to the NAND gate (168), only one combination causes the NAND gate (168) to output low. The other three input combinations cause the NAND gate (168) to output high. Assuming an independent and evenly distributed probability for the inputs to the NAND gate (168), the probability that a signal outputted from the NAND gate (168) is low is 0.25 and the probability that a signal outputted from the NAND gate (168) is high is 0.75. Accordingly, the signal from the NAND gate (168) is said to be "predominantly high."

In order to maximize the amount of implicit decoupling capacitance on the signal line (170) according to Equation 4, the signal line (170) is shielded such that both of the shielding lines (150) and (154) are connected to the ground bus (146). The signal on the signal line (170) is three times more likely to be high; therefore, the implicit decoupling capacitance created by implicit decoupling capacitance (172) and implicit decoupling capacitance (174) exists 75% of the time and provides essentially no implicit decoupling capacitance only 25% of the time.

Those skilled in the art will appreciate that shield assignment, whether it is with a power supply line and a ground line, with a power supply line and a power supply line, or with a ground line and a ground line, the delay of the signal on the signal line does not change. Using preferential shielding, therefore, does not increase the signal delay compared to typical shielding arrangements. By creating an imbalance in the implicit decoupling capacitance based on the probability the signal is at a specific value, the amount of implicit decoupling capacitance is increased.

Those skilled in the art will appreciate that ground line (150) and ground line (154) act as shields. Further, those skilled in the art will appreciate that a different potential can be used on shielding line (150) and shielding line (154). Those skilled in the art will also appreciate that only one shielding line (150) or shielding line (154) may be used.

By way of comparison, the average implicit decoupling capacitance in FIG. 2 and FIG. 3 are calculated assuming independent and evenly distributed probability for the inputs to all logic circuits, and the implicit decoupling capacitors are of equal value which are now referred to simply as "Decap". For FIG. 2, the signal line (62) has a 0.25 probability of being high and a 0.75 probability of being low. Accordingly, the average implicit decoupling capacitance is 0.25 Decap to the ground line (50) and 0.75 Decap to the power supply line (48). Likewise in FIG. 2, the signal line (70) has a 0.25 probability of being low and a 0.75 probability of being high. Accordingly, the average implicit decoupling capacitance is 0.25 Decap to the power supply line (52) and 0.75 Decap to the ground line (54). Essentially, the power supply lines (48) and (52) combined see one Decap and the ground lines (50) and (54) combined see one Decap. For FIG. 3, the signal line (162) has a 0.25 probability of being high and a 0.75 probability of being low. Accordingly, the average implicit decoupling capacitance is 0.75 * 2 * Decap, or 1.5 Decap, to power supply lines (148) and (152). Likewise in FIG. 3, the signal line (170) has a 0.25 probability of being low and a 0.75 probability of being high. Accordingly, the average implicit decoupling capacitance is 0.75 * 2* Decap, or 1.5 Decap, to ground lines (150) and (154). Those skilled in the art will appreciate that shielding the signal lines (162) and (170) with a preferential potential on the shielding lines in this manner increases the implicit decoupling capacitance associated with the signal lines (162) and (170).

Those skilled in the art will appreciate that although the embodiments shown in FIG. 3 use two-input logic gates, circuit logic having any number of inputs may be used, generally referred to as combinational logic. All that is required is that one be able to ascertain the probability of a value on an output signal from particular circuit logic. Further, those skilled in the art will appreciate that the embodiments shown in FIG. 3 may reside in an integrated circuit or other electrical component.

Figure 4:
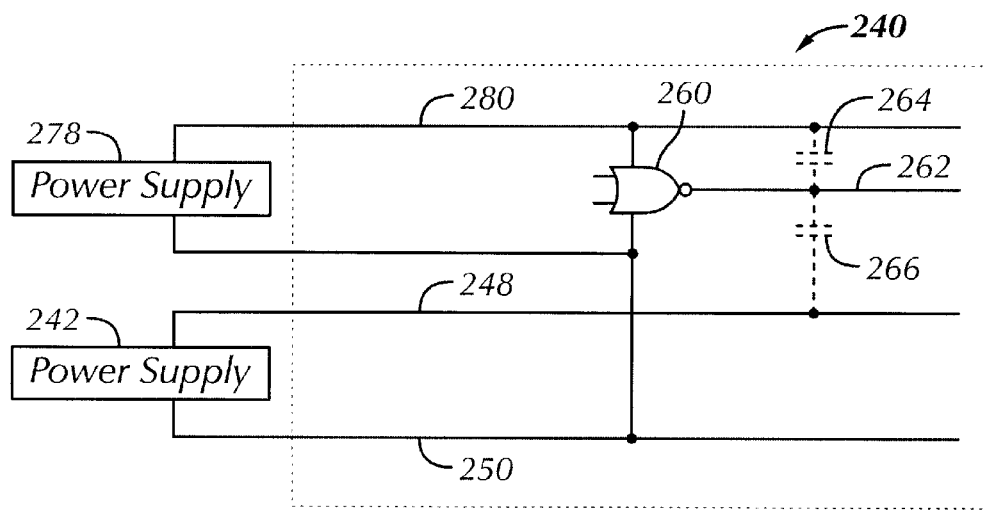
FIG. 4 shows a circuit in accordance with another embodiment of the present invention.

FIG. 4 shows an exemplary circuit (240) in accordance with an embodiment of the present invention. The circuit (240) has a power supply line (280) and a ground line (250) that provides power to, in this example, a two-input NOR gate (260). Power is provided to the power supply line (280) and the ground line (250) through a power supply (278). The power supply (278) may be a part of circuit (240) or a separate element. A power supply (242) also exists that supplies power through power supply line (248) and a ground line (250). The power supply (242) may be a part of circuit (240) or a separate element. In this embodiment, the ground line is common between both power supply (278) and power supply (242). Those skilled in the art will appreciate that the ground line (250) may actually be multiple lines that do not physically connect to one another. The two-input NOR gate (260) outputs a signal on a signal line, or signal path, (262). The implicit decoupling capacitance is equal to the implicit decoupling capacitance (264) between the signal line (262) and the power supply line (280), acting as a first shield, plus the implicit decoupling capacitance (266) between the signal line (262) and the power supply line (248), acting as a second shield, while the signal line (262) is low. The implicit decoupling capacitance is essentially zero while the signal line (262) is high. This relationship may be represented as shown in Equation 5:

$$C_{IMP}=(Decap_1+Decap_2)\text{ when Signal Line=low,}$$

$$C_{IMP}=0\text{ when Signal Line=high,}\quad\quad\text{(Equation 5)}$$

where Decap$_1$ is equal to the implicit decoupling capacitance (264) between the power supply line (280) and the signal line (262) when the signal line (262) is low, and where Decap$_2$ is equal to the implicit decoupling capacitance (266) between the power supply line (248) and the signal line (262) when the signal line (262) is low. When the signal line (262) is high, both the implicit decoupling capacitances (264) and (266) are essentially zero. From Equation 5, it is apparent that shielding signal line (262) with power supply line (280) and power supply line (248) increases the amount of implicit decoupling capacitance. In fact, the longer signal line (262) is low, the greater the implicit decoupling capacitance, as shown in Equation 5. Equally stated, the average implicit decoupling capacitance over time is the probability the signal line (262) is low times the implicit decoupling capacitance when the signal line (262) is low, as defined in Equation 5. The average decoupling capacitance AvgC$_{IMP}$ is:

$$AvgC_{IMP}=P_L*(Decap_1+Decap_2),\quad\quad\text{(Equation 6)}$$

where P$_L$ is equal to the probability that the signal is low. From Equation 6, it is apparent that in order to maximize the amount of implicit decoupling capacitance, the implicit decoupling capacitance is increased for the situation that has the higher probability on the signal line (262).

Of the four possible input combinations to the NOR gate (260), only one combination causes the NOR gate (260) to output high. The other three input combinations causes the NOR gate (260) to output low. Assuming an independent and evenly distributed probability for the inputs to the NOR gate (260), the probability that a signal outputted from the NOR gate (260) is high is 0.25 and the probability that a signal outputted from the NOR gate (260) is low is 0.75. Accordingly, the signal from the NOR gate (260) is said to be "predominantly low."

In order to maximize the amount of implicit decoupling capacitance on the signal line (262) according to Equation 6, the signal line (262) is shielded such that both of the shielding lines (280) and (248) are connected to the power supplies (278) and (242), respectively. The signal on signal line (262) is three times more likely to be low; therefore, the implicit decoupling capacitance created by implicit decoupling capacitance (264) and implicit decoupling capacitance (266) exists 75% of the time and provides essentially no implicit decoupling capacitance only 25% of the time.

Those skilled in the art will appreciate that shield assignment, whether it is with a power supply line and a ground line, with a power supply line and a power supply line, or with a ground line and a ground line, the delay of the signal on the signal line does not change. Using preferential shielding, therefore, does not increase the signal delay compared to typical shielding arrangements. By creating an imbalance in the implicit decoupling capacitance based on the probability the signal is at a specific value, the amount of implicit decoupling capacitance is increased.

Still referring to FIG. 4, the power supply (278) connects to the implicit decoupling capacitance (264) through shielding line (280), and power supply (242) connects to the implicit decoupling capacitance (266) through shielding line (248). The power supplies (278) and (242) are not required to operate at the same potential. Consequently, the decoupling ability of the implicit decoupling capacitance (264) and the implicit decoupling capacitance (266) may not be same due to the stored charge differences. Those skilled in the art will appreciate that shielding the signal line (262) with one or more preferential potentials on the shielding lines in this manner increases the ability of the implicit decoupling capacitance associated with the signal line (262) to maintain the potential on the shielding lines. Those skilled in the art will also appreciate that only one shielding line (280) or shielding line (248) may be used.

Those skilled in the art will appreciate that although the embodiments shown in FIG. 4 use a two-input logic gate, circuit logic having any number of inputs may be used, generally referred to as combinational logic. Also, although a NAND gate is used for purposes of illustration, any type of logic gate may be used. All that is required is that one be able to ascertain the probability of a value on an output signal from particular circuit logic. Further, those skilled in the art will appreciate that the embodiments shown in FIG. 4 may reside in an integrated circuit or other electrical component.

Figure 5:
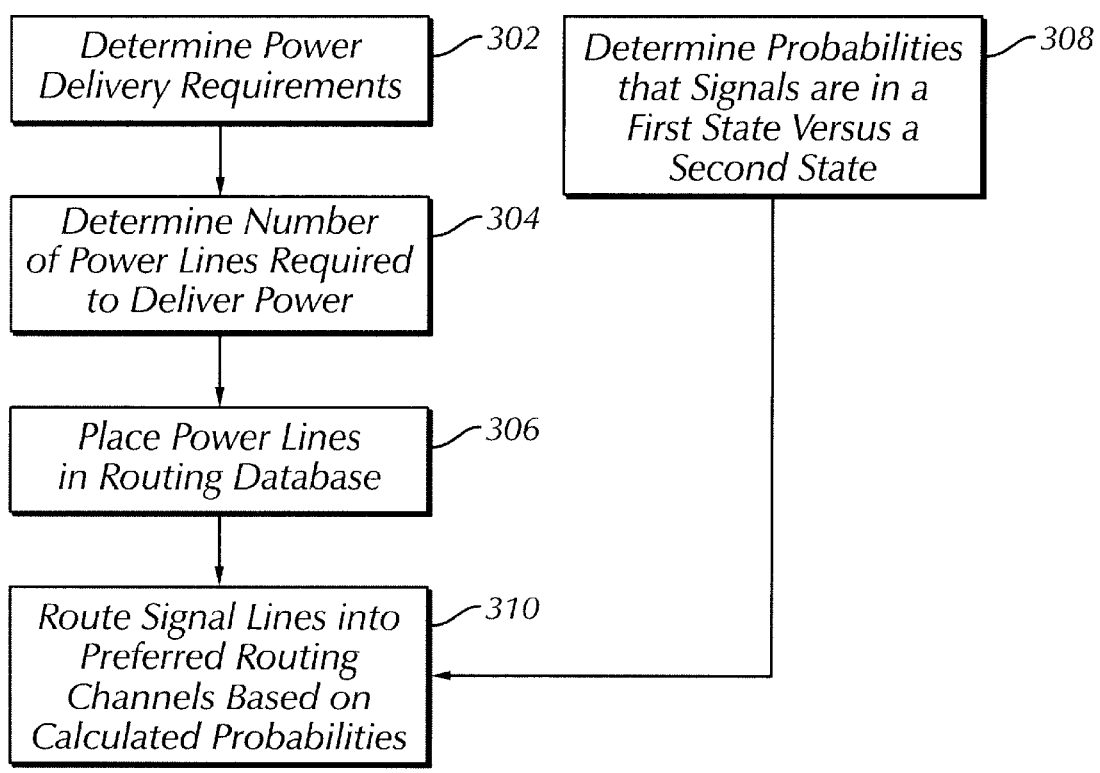
FIG. 5 shows a flow chart in accordance with some embodiments of the present invention.

In FIG. 5, an exemplary flow process is shown in accordance with an embodiment of the present invention. Particularly, the flow process shows how an embodiment of the present invention allows routing of a signal line amongst preferential shielding lines. Power lines in this embodiment provide power between a power supply and combinational logic, and shield lines. In step 302, we first determine power requirements for power delivered between a power supply and combinational logic. In step 304, the number of power lines required to deliver the power from a power supply to combinational logic is determined. The number of power lines is determined from the power transmission requirement calculation performed in step 302.

In the design of an integrated circuit, connecting lines connect one element to another. Due to the large number of connections that are needed, a routing program executed on a computer is used to appropriately create the required connections. In step 306, the routing program is used to first place the required number of power lines that connect the power supply to the combinational logic. In step 308, the probability that the signals from the combinational logic are in a first state versus a second state is determined. In step 310, based on the probabilities that the signals are in a first state versus a second state, a preferred routing channel among preferred power lines is identified and used to route the signal.

Those skilled in the art will appreciate that although the steps shown in FIG. 5 refer to a routing channel, it is understood that a routing channel implies a region available for placement of one or more signal lines. Furthermore, the placement of the signal line may or may not be required to adhere to a grid. Also, the placement of the signal line may include additional rules that constrain the location of the routing. Further, those skilled in the art will appreciate that the steps shown in FIG. 5 refer to the method of creating the information, or database, necessary to manufacture an integrated circuit or other electrical component.

Figure 6:
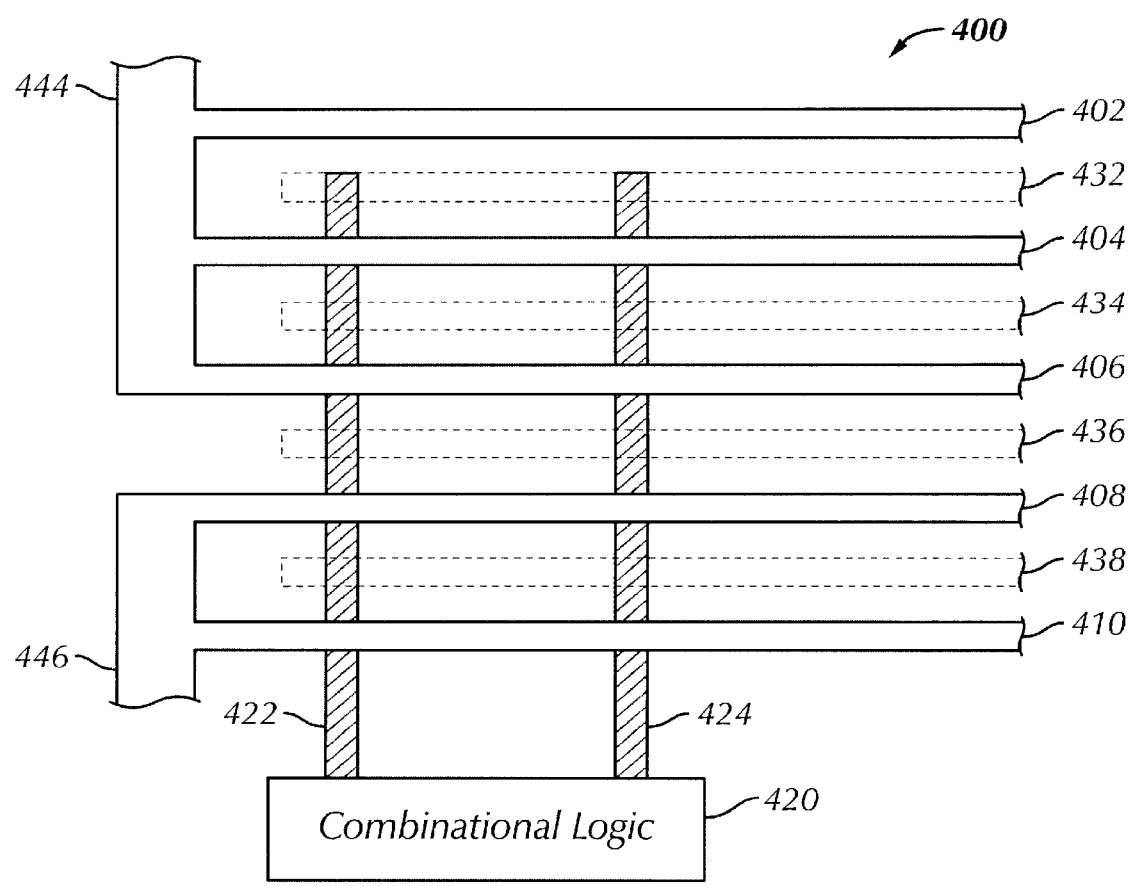
FIG. 6 is a multilevel routing channel in accordance with an embodiment of the present invention.

Another tool used with a database that includes information for the manufacture of an integrated circuit or other electrical component is a computer system and program to display the information in a graphical format. FIG. 6 shows an exemplary display of a section of routing (400) in accordance with an embodiment of the present invention. The routing section (400) has a power supply bus (444) that provides power to a combinational circuit or circuits (not shown) via routed power supply lines (402, 404, and 406). The routing is maintained in the same layer. The routing section (400) also has another power supply bus (446) that provides power to a combinational circuit or circuits (not shown) via routed power supply lines (408, 410), where the routing is maintained in the same layer as power supply bus (444) and its associated power supply lines (402, 404, and 406).

Also shown in routing section (400) is a set of possible routing channels (432, 434, 436, and 438) that are not yet assigned to any particular signal line. Possible routing channels (432, 434) are shielded by the potential on the power supply bus (444). Possible routing channel (438) is shielded by the potential on the power supply bus (446), and possible routing channel (436) is shielded by the potential on the power supply bus (444) and by the potential on the power supply bus (446).

Still referring to FIG. 6, a placeholder for the combinational logic (420) displays the location of the combinational logic, but does not show any details about the logic elements within the combinational logic (420). In this example, the combinational logic (420) has two outputs (422) and (424). Both of the combinational logic outputs (422) and (424) are routed in a layer below the layer used to route the power supply bus (444) and its associated power supply lines (402, 404, and 406), and power supply bus (446) and its associated power supply lines (408, 410).

The routing program must make a connection from the two outputs (422) and (424) with one or more of the possible routing channels (432, 434, 436, 438). The probability that the output signal (422) is in a first state versus a second state determines which possible routing channels (432, 434, 436, 438) are preferred. Additionally, the probability that the output signal (424) is in a first state versus a second state determines which possible routing channels (432, 434, 436, 438) are preferred. One skilled in art will appreciate that connections between the two outputs (422, 424) and the possible routing channels (432, 434, 436, 438) may also be based on other constraints such as, but not limited to, a computed probability having a greater value for one output versus another output, prioritization of which outputs are routed first, availability of remaining routing channels, and spacing requirements.

Those skilled in art will appreciate that power supply (444) and power supply (446) could have different potentials, which includes ground as a potential. One skilled in art will also appreciate that signals and/or power can be transmitted on multiple routing layers but still achieve the desired preferential shielding. Further, one skilled in art will appreciate that signals may be routed based on an ordered, or prioritized list, in combination with the probability of the signal being in a first versus second state.

Those skilled in art will appreciate that a method is described to first route the power supply lines, including ground, that both transmits power and acts as a shielding element, and then route signal lines among the power lines based on the probability of the signal line being in a first state versus a second state to increase implicit decoupling capacitance on an integrated circuit or electrical component.

Those skilled in art will appreciate that a computer system is described to first route the power supply lines, including ground, that both transmits power and acts as a shielding element, and then route signal lines among the power lines based on the probability of the signal line being in a first state versus a second state to increase implicit decoupling capacitance on an integrated circuit or electrical component.

Those skilled in art will appreciate that a computer-readable medium having recorded thereon instructions executable by a processor is described to first route the power supply lines, including ground, that both transmits power and acts as a shielding element, and then route signal lines among the power lines based on the probability of the signal line being in a first state versus a second state to increase implicit decoupling capacitance on an integrated circuit or electrical component.

Advantages of the present invention may include one or more of the following. In some embodiments, because a signal is preferentially shielded, a circuit may have more decoupling capacitance than when the signal is not shielded by a preferred potential.

In some embodiments, because a signal is shielded with a preferred potential, increased decoupling capacitance is provided to one or more components in a computer system, effectively leading to better system performance.

In some embodiments, because implicit decoupling capacitance is increased through preferential shielding, fewer explicit decoupling capacitors may be needed, and thus, more components may be positioned on an integrated circuit.

In some embodiments, because implicit decoupling capacitance is higher, the number of explicit decoupling capacitors that must be added is reduced; therefore, a smaller integrated circuit die may be used.

While the present invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for preferentially shielding a signal path having a value switchable between a first potential and a second potential, comprising:
   determining a probability of the value being at the first potential versus the second potential;
   assigning a third potential to a first plurality of shields;
   assigning a fourth potential to a second plurality of shields;
   defining a plurality of possible routing channels among the first plurality of shields and the second plurality of shields; and
   assigning the signal path to one of the plurality of possible routing channels depending on a relationship among the probability, the third potential and the fourth potential.

2. The method of claim 1, wherein the third potential is closer in value to the first potential than to the second potential, and wherein when the probability of the value of the signal being at the second potential is greater, said one of the plurality of possible routing channels is shielded by the first plurality of shields.

3. The method of claim 2, wherein when the probability of the value of the signal being at the first potential is greater, said one of the plurality of possible routing channels is shielded by the second plurality of shields.

4. The method of claim 1, wherein the first plurality of shields and the second plurality of shields are operatively connected to a power supply.

5. The method of claim 1, wherein the signal path is operatively connected to a logic component.

6. The method of claim 1, wherein the first potential is a logic low and the second potential is a logic high.

7. The method of claim 6, wherein the third potential is ground and the fourth potential is power.

8. An integrated circuit, comprising:
   a signal having a value switchable between a first potential and a second potential, the value having a probability of being at the first potential versus the second potential;
   a first plurality of shields at a third potential; and
   a second plurality of shields at a fourth potential;
   wherein the signal is routed along one of a plurality of possible routing channels among the first plurality of shields and the second plurality of shields; and
   wherein said one of the plurality of possible routing channels is selected based upon a relationship among the probability, the third potential and the fourth potential.

9. The integrated circuit of claim 8, wherein the third potential is closer in value to the first potential than to the second potential, and wherein when the probability of the value of the signal being at the second potential is greater, said one of the plurality of possible routing channels is shielded by the first plurality of shields.

10. The integrated circuit of claim 9, wherein when the probability of the value of the signal being at the first potential is greater, said one of the plurality of possible routing channels is shielded by the second plurality of shields.

11. The integrated circuit of claim 8, wherein the first plurality of shields and the second plurality of shields are operatively connected to a power supply.

12. The integrated circuit of claim 8, wherein the signal path is operatively connected to a logic component.

13. The integrated circuit of claim 8, wherein the first potential is a logic low and the second potential is a logic high.

14. The integrated circuit of claim 13, wherein the third potential is ground and the fourth potential is power.

15. A computer system for preferentially routing a signal having a value switchable between a first potential and a second potential on an integrated circuit, comprising:

a processor;

a memory; and software instructions stored in the memory for enabling the computer system under control of the processor, for:

determining a probability of the value being at the first potential versus the second potential;

assigning a third potential to a first plurality of shields;

assigning a fourth potential to a second plurality of shields;

defining a plurality of possible routing channels among the first plurality of shields and the second plurality of shields; and assigning the signal to one of the plurality of possible routing channels depending on a relationship among the probability, the third potential and the fourth potential.

16. The computer system of claim 15, wherein the third potential is closer in value to the first potential than to the second potential, and wherein when the probability of the value of the signal being at the second potential is greater, said one of the plurality of possible routing channels is shielded by the first plurality of shields.

17. The computer system of claim 16, wherein when the probability of the value of the signal being at the first potential is greater, said one of the plurality of possible routing channels is shielded by the second plurality of shields.

18. The computer system of claim 15, wherein the first plurality of shields and the second plurality of shields are operatively connected to a power supply.

19. The computer system of claim 15, wherein the signal path is operatively connected to a logic component.

20. The computer system of claim 15, wherein the first potential is a logic low and the second potential is a logic high.

21. The computer system of claim 20, wherein the third potential is ground and the fourth potential is power.

22. A computer-readable medium having recorded thereon instructions executable by a processor, the instructions for:

determining a probability of a signal value being at a first potential versus a second potential;

determining a third potential of a first plurality of shields;

determining a fourth potential of a second plurality of shields;

identifying a plurality of possible routing channels among the first plurality of shields and the second plurality of shields; and assigning the signal to one of the plurality of possible routing channels depending on a relationship among the probability, the third potential and the fourth potential.

23. The computer-readable medium of claim 22, wherein the third potential is closer in value to the first potential than to the second potential, and wherein when the probability of the value of the signal being at the second potential is greater, said one of the plurality of possible routing channels is shielded by the first plurality of shields.

24. The computer-readable medium of claim 23, wherein when the probability of the value of the signal being at the first potential is greater, said one of the plurality of possible routing channels is shielded by the second plurality of shields.

25. The computer-readable medium of claim 22, wherein the first plurality of shields and the second plurality of shields are operatively connected to a power supply.

26. The computer-readable medium of claim 22, wherein the signal path is operatively connected to a logic component.

27. The computer-readable medium of claim 22, wherein the first potential is a logic low and the second potential is a logic high.

28. The computer-readable medium of claim 27, wherein the third potential is ground and the fourth potential is power.

* * * * *

UNITED STATES PATENT AND TRADEMARK OFFICE
CERTIFICATE OF CORRECTION

PATENT NO. : 6,629,306 B2
DATED : September 30, 2003
INVENTOR(S) : Sudhakar Bobba et al.

It is certified that error appears in the above-identified patent and that said Letters Patent is hereby corrected as shown below:

<u>Title page,</u>
Item [57], ABSTRACT,
Line 7, replace "2using" with -- using --.

Signed and Sealed this

Seventeenth Day of February, 2004

JON W. DUDAS
*Acting Director of the United States Patent and Trademark Office*